United States Patent [19]

Petersen et al.

[11] 3,976,872
[45] Aug. 24, 1976

[54] GALLIUM PHOSPHIDE PHOTODETECTOR HAVING AN AS-GROWN SURFACE AND PRODUCING AN OUTPUT FROM RADIATION HAVING ENERGIES OF 2.2 EV TO 3.8 EV

[75] Inventors: Paul E. Petersen, Minnetonka; Richard G. Schulze, Hopkins, both of Minn.

[73] Assignee: Honeywell Inc., Minneapolis, Minn.

[22] Filed: Apr. 7, 1975

[21] Appl. No.: 565,920

Related U.S. Application Data

[63] Continuation of Ser. No. 420,174, Nov. 29, 1973, Pat. No. 3,915,754.

[52] U.S. Cl. ............................. 250/211 R; 357/29
[51] Int. Cl.² ..................................... H01J 39/12
[58] Field of Search ............ 250/211 R, 211 J, 372, 250/551; 357/29, 30

[56] References Cited

UNITED STATES PATENTS

| | | | |
|---|---|---|---|
| 3,585,087 | 6/1971 | Blum et al. | 357/30 |
| 3,586,857 | 6/1971 | Glasow | 357/30 |
| 3,675,026 | 7/1972 | Woodall | 250/211 J |
| 3,715,245 | 2/1973 | Barnett et al. | 357/30 |
| 3,717,799 | 2/1973 | Chapman | 357/30 |
| 3,748,480 | 7/1973 | Coleman | 250/211 J |
| 3,761,837 | 9/1973 | Leheny et al. | 357/29 |

Primary Examiner—David C. Nelms
Attorney, Agent, or Firm—David R. Fairbairn

[57] ABSTRACT

Anomalously large photoresponse to radiation of energies between about 2.8 eV and about 3.8 eV has been observed in certain gallium phosphide photodetectors having an "as-grown" surface. This photoresponse is believed to be due to the low density of recombination centers in the as-grown surface.

18 Claims, 5 Drawing Figures

3,976,872

GALLIUM PHOSPHIDE PHOTODETECTOR HAVING AN AS-GROWN SURFACE AND PRODUCING AN OUTPUT FROM RADIATION HAVING ENERGIES OF 2.2 EV TO 3.8 EV

This is a continuation, of application Ser. No. 420,174, filed Nov. 29, 1973.

REFERENCE TO CO-PENDING APPLICATION

Reference should be made to a co-pending application Ser. No. 420,175 now U.S. Pat. No. 3,915,754 by R. G. Schulze and P. E. Petersen entitled "Growth of Gallium Phosphide" which was filed on even date (Nov. 29, 1973) herewith, and which is assigned to the same assignee as the present application.

BACKGROUND OF THE INVENTION

The present invention was made under a contract with the Department of the Air Force. The invention is concerned with gallium phosphide photodetectors. In particular, the present invention is directed to gallium phosphide photodetectors which exhibit a large photoresponse for radiation of energies between about 2.8 eV and about 3.8 eV.

Gallium phosphide is a semiconductor material having an indirect bandgap of 2.24 eV and a direct bandgap of 2.8 eV. Visible wavelength photodetectors may, therefore, be made from gallium phosphide. Compared to cadmium sulfide and other visible wavelength detectors, much less work has been done on the photoconductive properties of gallium phosphide. Previous work has shown, however, that copper can act as a photosensitization center in gallium phosphide, yielding photoconductive gains as high as $10^4$ but with long response times. Among the references describing the photoconductive properties of gallium phosphide are G. W. Allen and R. J. Cherry, J. Phys. Chem. Solids 23, 509 (1962); H. G. Grimmeiss and H. Scholz, Philips Res. Reports, 20, 107 (1965); P. Goldstein and S. S. Perlman, Phys. Rev., 148, 715 (1966); D. L. Bowman, J. Appl. Phys., 38, 568 (1967); D. F. Nelson et al, Phys. Rev., 135, A1399 (1964); and U.S. Pat. Nos. 3,261,080 and 3,412,252.

SUMMARY OF THE INVENTION

The gallium phosphide photodetectors of the present invention exhibit unusually large photoresponse to radiation of energies between about 2.8 eV and about 3.8 eV. Substantial photoresponse to radiation of energies greater than 3.0 eV has not previously been observed in gallium phosphide photodetectors.

The gallium phosphide photodetectors of the present invention are preferably fabricated from a body of gallium phosphide having an as-grown surface. The electrical contact means for deriving the photosignal from the gallium phosphide are attached to the as-grown surface. As used in this specification, the term as-grown surface is defined as a surface of a crystal which is not modified in any way by mechanical or chemical polishing or etching. In other words, the crystal surface remains in its as-grown state.

DESCRIPTION OF THE PREFERRED EMBODIMENTS

Figure 1:
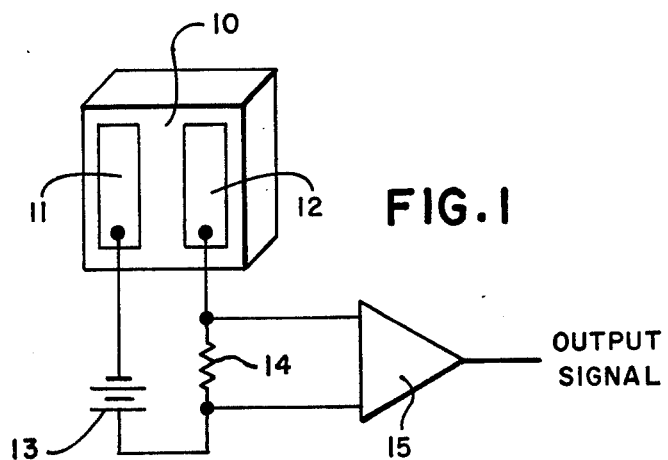
FIG. 1 shows a gallium phosphide photodetector.

FIG. 1 shows a typical photoconductive gallium phosphide detector. Attached to one surface of gallium phosphide body 10 are electrical contacts 11 and 12. The detector is connected in series with battery 13 and load resistor 14. The resistance $R_d$ of the detector is much greater than the resistance $R_L$ of the load resistor 14. The detector, therefore, is operating in the constant voltage mode. Amplifier 15 amplifies the voltage across load resistor 14 to produce an output signal.

The gallium phosphide body 10 is grown by the process described in the previously mentioned co-pending patent application Serial Number 420,175 now U.S. Pat. No. 3,915,754 by R. G. Schulze and P. E. Peterson entitled "Growth of Gallium Phosphide." In this method, n-type gallium phosphide suitable for photodetector applications is grown from a liquid solution. The photoconductive detectors of the present invention have utilized both copper-doped and undoped gallium phosphide. The copper-doped gallium phosphide is grown from a liquid solution of gallium, gallium phosphide, and copper, while the undoped gallium phosphide is grown from a liquid solution of gallium phosphide and gallium.

The detectors of the present invention were formed on as-grown surfaces. In other words, the electrical contacts 11 and 12 were attached to an exterior surface of the crystal which had not been lapped, polished, etched, or otherwise modified.

Other gallium phosphide photodetectors were formed on gallium phosphide crystals whose surfaces had been prepared by lapping and etching. The gallium phosphide crystals were lapped on two sides using 3.0 micron alumina on glass or 0.3 micron alumina on Beuhler Microcloth. After lapping, the crystals were cleaned with a mix of acetone: toulene: methanol and then with detergent and water. The crystals were then etched in a solution of $HCl:H_2O:HNO_3$ until all visual evidence of the lapping was gone. The crystals were then rinsed in deionized distilled water and blown dry.

Two types of electrical contacts were used with both the as-grown detectors and the "lapped and etched" detectors. The first type of electrical contact was made to the surface by depositing 600 to 700 A of Ag:1%Te followed by a 500 to 600 A layer of nickel. The second type of electrical contact was made by ultrasonically soldering In:1%Te to the surface. Both types of contacts were heat treated at 680°C in a hydrogen atmosphere. Photo and dark current-voltage (I-V) measurements indicated that these metal contacts made good ohmic contact to the gallium phosphide. The linearity of the I-V characteristics was sufficient to insure that contact effects were minimal and that the conductivity was controlled by bulk mechanisms. The photoresponse was independent of the type of contact used.

Figure 2:
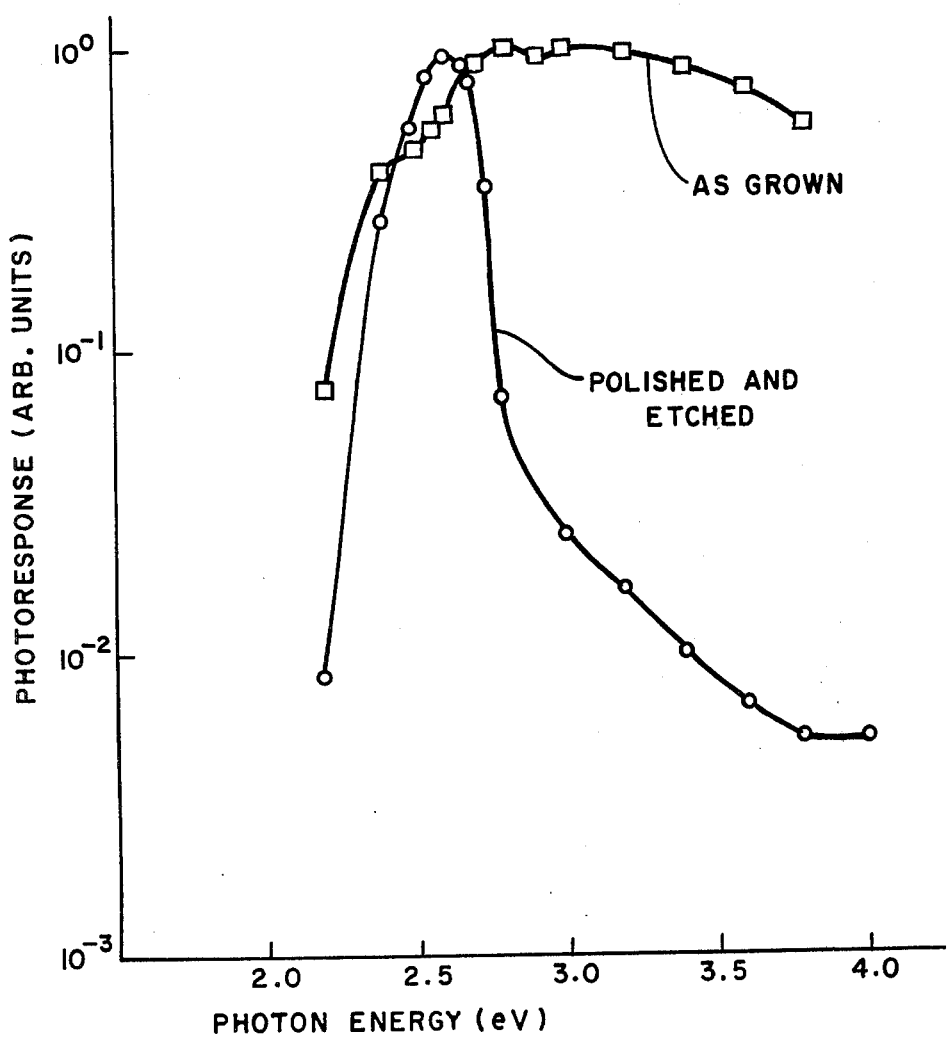
FIG. 2 is a graph of relative photoresponse as a function of photon energy for two typical copper-doped gallium phosphide photodetectors; one detector has electrical contacts on a polished and etched surface while the other detector has electrical contacts on an as-grown surface.

FIG. 2 shows the relative photoresponse of two copper-doped gallium phosphide detectors fabricated from material from the same growth run. One of the detectors had electrical contacts attached to a polished and etched surface, while the other detector had electrodes attached to an as-grown surface. These photoresponse measurements were made at the same photon flux density for both detectors.

The spectral response of the polished and etched detectors has its low energy (long wavelength) cut off at about 2.24 eV, which corresponds to the indirect bandgap of gallium phosphide. In addition, the polished and etched detector has a high energy cut off at about 2.75 eV. This high energy cut off is believed to be the result of surface recombination. As the energy of the radiation is increased, the absorption occurs nearer to the surface. The surface is less perfect than the bulk material due to the lapping and etching and hence has a greater density of recombination centers with a corresponding decrease in free electron lifetimes. This high energy cut off at about 2.75 eV is typical of gallium phosphide photodetectors fabricated on polished and etched surfaces.

As shown in FIG. 2, the spectral response of the detector formed on an as-grown surface is quite different from the spectral response of the detector formed on a lapped and etched surface. The spectral response peaks near the direct band edge of 2.8 eV. Unlike the detectors formed on lapped and etched surfaces, however, the spectral response remains nearly flat out to the limits of the experimental apparatus (3.8 eV). Significant photoresponse to energies greater than 3.0 eV has not previously been reported for gallium phosphide detectors. These results indicate that the detectors formed on an as-grown surface are significantly better than detectors formed on polished and etched surfaces in that the surface recombination rate of as-grown surfaces is very low. It is believed, therefore, that the density of recombination centers at and near the as-grown surface is essentially the same as the density of recombination centers in the interior of the gallium phosphide body.

Figure 3:
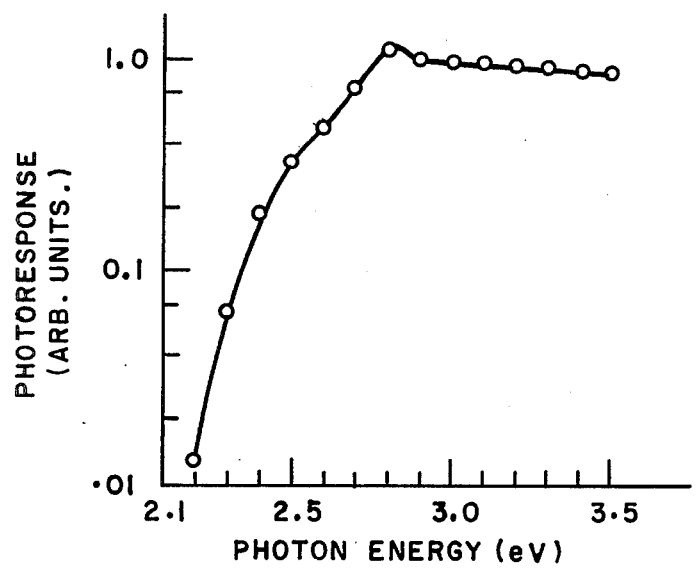
FIG. 3 shows relative photoresponse as a function of photon energy for another copper-doped gallium phosphide photo-detector fabricated on an as-grown surface.

FIG. 3 shows the relative photoresponse as a function of photon energy for another copper-doped gallium phosphide detector. Once again, the detector had electrical contacts attached to an as-grown surface. The spectral response once again peaked at about 2.8 eV and remained substantially constant to about 3.5 eV.

Figure 4:
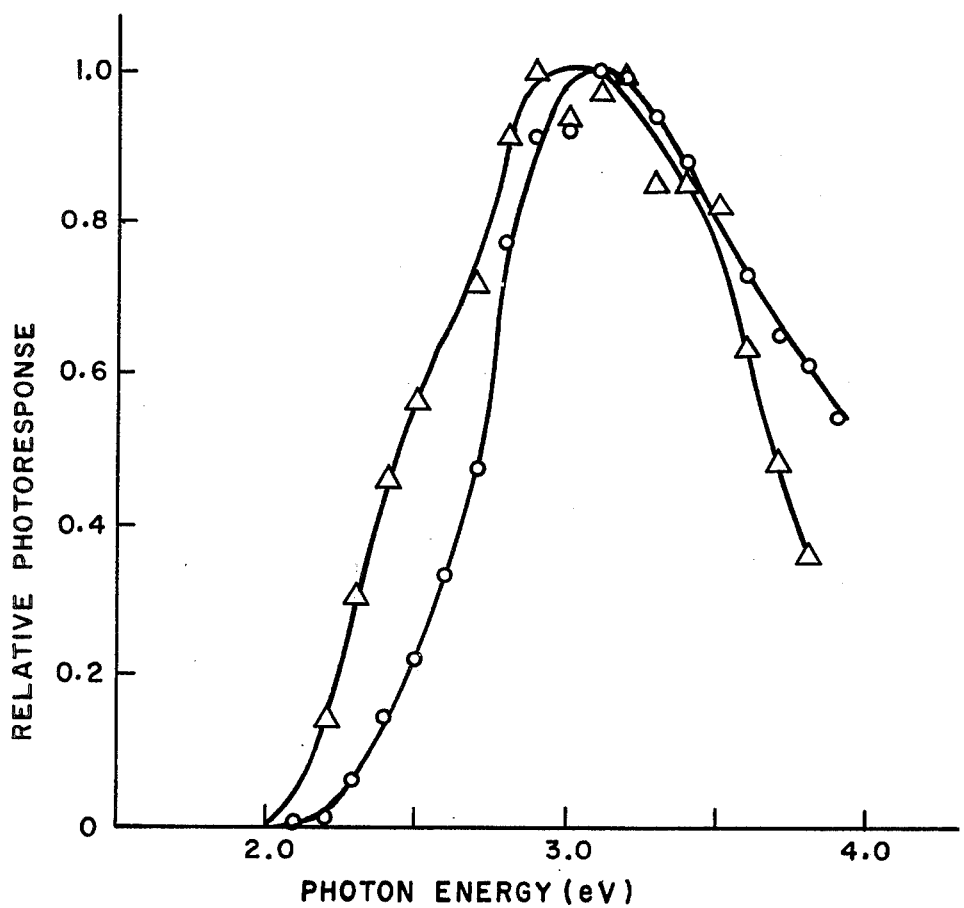
FIG. 4 shows the relative photoresponse as a function of photon energy for two undoped gallium phosphide photodetectors fabricated on as-grown surfaces.

This unusual photoresponse at high energies was also observed in undoped gallium phosphide detectors using as-grown surfaces. FIG. 4 shows the relative photoresponse as a function of photon energy for two photodetectors using undoped gallium phosphide with an as-grown surface. As previously mentioned, copper acts as a sensitizing center in gallium phosphide. The undoped gallium phosphide detectors, therefore, exhibited lower sensitivity than did the copper-doped detectors.

The preferred gallium phosphide photodetector of the present invention, therefore, utilizes a copper-doped gallium phosphide body having an as-grown surface. The extended high energy response is apparently due to the nature of the as-grown surface which results from the solution growth method described in the previously mentioned patent application Ser. No. 420,175, now U.S. Pat. No. 3,915,754 and P. E. Petersen.

Figure 5:
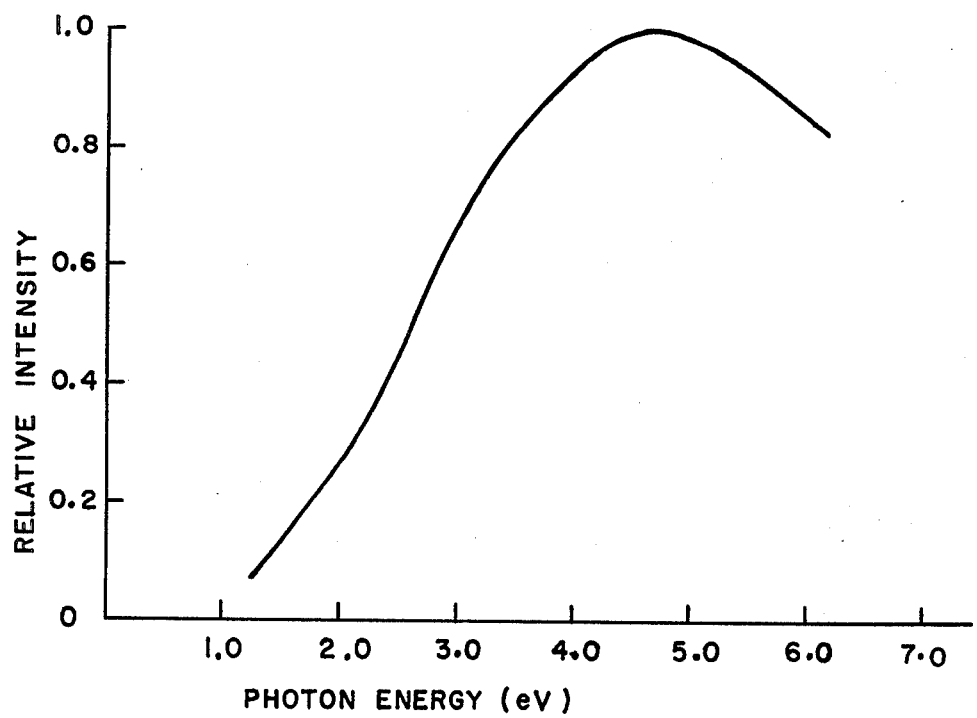
FIG. 5 shows the spectral distribution of a 11,000°K black body.

The high energy response of the detectors of the present invention has many applications. One important application is in the detection of a high temperature black body source, as is done in AO star detector. FIG. 5 shows the spectral distribution of an 11,000°K black body. The intensity of the black body is increasing from 2.1 eV to 3.8 eV. The advantage of the gallium phosphide photodetectors of the present invention over the gallium phosphide photodetectors having a high energy cut off at 2.8 eV is apparent.

In conclusion, gallium phosphide photodetectors exhibiting anomalously large photoresponse to radiation of energy between about 2.8 eV and about 3.8 eV have been developed. Substantial photoresponse to radiation of energies greater than 3.0 eV has not previously been observed in gallium phosphide detectors.

While this invention has been disclosed with reference to preferred embodiments, it should be understood by those skilled in the art that changes in form and detail may be made without departing from the spirit and scope of the invention.

We claim:
1. A photodetector comprising:
a body of gallium phosphide having an as-grown surface; and
electrical contact means attached to the as-grown surface.
2. The gallium phosphide photodetector of claim 1 wherein the body was grown from a liquid solution.
3. The gallium phosphide photodetector of claim 2 wherein the liquid solution included gallium and gallium phosphide.
4. The gallium phosphide photodetector of claim 3 wherein the liquid solution further included copper.
5. The gallium phosphide photodetector of claim 1 wherein the body has n-type conductivity.
6. The gallium phosphide photodetector of claim 5 wherein the body of gallium phosphide contains copper impurities.
7. A photodetector comprising:
a body of gallium phosphide having a surface, the gallium phophide proximate the surface having a density of recombination centers which is essentially the same as the density of recombination centers in the gallium phosphide in the interior of the body; and
electrical contact means attached to the surface.
8. The gallium phosphide photodetector of claim 7 wherein the body was grown from a liquid solution.
9. The gallium phosphide photodetector of claim 7 wherein the surface is an as-grown surface.
10. The gallium phosphide photodetector of claim 7 wherein the body has n-type conductivity.
11. The gallium phosphide photodetector of claim 10 wherein the body contains copper impurities.
12. A photodetector comprising:
gallium phosphide means for exhibiting a substantially constant photoresponse to radiation of energies between about 2.8 eV and about 3.8 eV; and
electrical contact means attached to the gallium phosphide means for deriving a photosignal therefrom.
13. The gallium phosphide photodetector of claim 12 wherein the gallium phosphide photodetector has n-type conductivity.
14. The gallium phosphide photodetector of claim 13 wherein the gallium phosphide photodetector is sensitized with copper.

15. A photodetector comprising:
gallium phosphide means for producing a photosignal in response to radiation of energies between about 2.2 eV and about 3.8 eV, the gallium phosphide means comprising:
a bulk region for producing a photosignal in response to radiation of energies between about 2.2 eV and about 2.8 eV, and
a surface region for producing a photosignal in response to radiation of energies between about 2.8 eV and about 3.8 eV; and
electrical contact means attached to the surface region for deriving a photosignal from the gallium phosphide means.

16. The photodetector of claim 15 wherein the gallium phosphide means has n-type conductivity.

17. The photodetector of claim 16 wherein the gallium phosphide means is sensitized with copper.

18. A method of detecting radiation of energy within the range of about 3.0 eV to about 3.8 eV, the method comprising:
providing a gallium phosphide body capable of producing a photosignal in response to radiation of energy between about 3.0 and 3.8 eV which is no less than one tenth of a peak photosignal produced by the body for radiation of energy between about 2.2 eV and 3.8 eV;
exposing a surface of the gallium phosphide body to radiation including radiation of energy within the range of about 3.0 eV to about 3.8 eV; and
sensing a photosignal produced by the gallium phosphide body.

* * * * *